(12) United States Patent
Sekine

(10) Patent No.: US 7,106,772 B2
(45) Date of Patent: Sep. 12, 2006

(54) DISTRIBUTED FEEDBACK SEMICONDUCTOR LASER

(75) Inventor: Norihiko Sekine, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 296 days.

(21) Appl. No.: 10/747,170

(22) Filed: Dec. 30, 2003

(65) Prior Publication Data

US 2004/0151222 A1    Aug. 5, 2004

(30) Foreign Application Priority Data

Feb. 5, 2003    (JP) .............................. 2003-028555

(51) Int. Cl.
*H01S 5/00* (2006.01)
(52) U.S. Cl. ......................... 372/45; 372/43
(58) Field of Classification Search ............ 372/43, 372/45
See application file for complete search history.

(56) References Cited

U.S. PATENT DOCUMENTS 5,425,042 A * 6/1995 Nido et al. ............... 372/45.01
2003/0007765 A1 * 1/2003 Sato et al. .................. 385/129
2003/0047738 A1 * 3/2003 Funabashi et al. ............ 257/79

FOREIGN PATENT DOCUMENTS

JP    2003324243 A * 11/2003

OTHER PUBLICATIONS

M.-C. Amann et al.; "Tunable twin-guide laser: A novel laser diode with improved tuning performance"; *Applied Physics Letters*; vol. 54; 1989; pp. 2532-2533./Discussed in the specification.

* cited by examiner

*Primary Examiner*—Minsun Oh Harvey
*Assistant Examiner*—Dung Nguyen
(74) *Attorney, Agent, or Firm*—Armstrong, Kratz, Quintos, Hanson & Brooks, LLP

(57) ABSTRACT

A tuning layer is disposed spaced by some distance apart from an active layer in a thickness direction, the tuning layer having a transition wavelength shorter than a wavelength of light radiated from the active layer. A diffraction grating layer is disposed between the active layer and tuning layer, a refractive index of the diffraction grating layer being periodically changed along an optical resonator direction. A first electrode supplies the active layer with current. A second electrode supplies the tuning layer with current independently from the current to be supplied to the active layer. A TTG-DFB laser is provided which can maintain a proper coupling coefficient and has characteristics suitable for application to communication light sources.

11 Claims, 5 Drawing Sheets

DISTRIBUTED FEEDBACK SEMICONDUCTOR LASER

CROSS REFERENCE TO RELATED APPLICATION

This application is based on and claims priority of Japanese Patent Application No. 2003-28555 filed on Feb. 5, 2003, the entire contents of which are incorporated herein by reference.

BACKGROUND OF THE INVENTION

A) Field of the Invention

The present invention relates to a semiconductor laser, and more particularly to a tunable twin-guide distributed feedback (TTG-DFB) type laser.

B) Description of the Related Art

Present backbone transmission systems for large capacity optical communication networks utilize wavelength division multiplexing (WDM) which can increase the capacity of transmission by multiplexing optical signals on a wavelength axis. As the degree of multiplexing is made high, the number of semiconductor lasers to be used as light sources increases. Backup light sources are also required as many as or larger than that of semiconductor lasers, resulting in annoying stock management. Simplifying the management of tunable optical light sources has been desired. Wavelength routing techniques have been paid attention, which dynamically change a routing destination depending upon the wavelength.

A distributed Bragg reflector (DBR) laser is known as one example of tunable lasers. FIG. 4A is a cross sectional view of a conventional tunable DBR laser. On a lower clad layer 100, an active layer 101 and an upper clad layer 103 are formed. Along the longitudinal direction of an optical resonator, a gain region G, a phase adjusting region P and a DBR region R are defined in this order. In the DBR region R, a diffraction grating 102 is disposed near the active layer 101.

Current is supplied to the gain region G by an electrode 104, to the phase adjusting region P by an electrode 105, and to the DBR region R by an electrode 106. As the current is supplied to the gain region G, laser oscillation occurs. As the current is injected into the DBR region R, the oscillation wavelength can be changed. The oscillation wavelength is determined by the longitudinal mode nearest to the wavelength at which the loss of an optical resonator is minimum, so that the wavelength change is discrete. By adjusting the injection amount of current into the phase adjusting region P, it is possible to realize a quasi-continuous wavelength change.

With this method, however, it is necessary to control both the injection currents into the DBR region R and phase adjusting region P, resulting in a complicated control system. When the relation between wavelength and current shifts after a long time operation, it is difficult to follow a change in wavelength, leaving a reliability problem.

A TTG- DFB laser is known as a semiconductor laser which can eliminate the difficulty in controlling a tunable DBR laser. Refer to "Tunable twin-guide laser: A novel laser diode with improved tuning performance" by M. C. Amann, S. Illek, C. Schanen, and W. Thulk, Applied Physics Letters, Vol. 54, (1989), pp. 2532–2533.

FIG. 4B is a cross sectional view of a TTG-DFB laser. A tuning layer 111, an intermediate layer 112, an active layer 113, a diffraction grating 114 and an upper clad layer 115 are stacked in this order on a substrate 110 also serving as a lower clad layer. From the viewpoint of optical transmission mode, the layers of the tuning layer 111 to the diffraction grating 114 are disposed near each other so that they exist in the same mode. An electrode 117 is formed on the bottom surface of the substrate 110, and an electrode 116 is formed on the upper clad layer 115.

The intermediate layer 112 has a conductivity type opposite to that of the substrate 110 and upper clad layer 115. The tuning layer 111 and active layer 113 are electrically independent from each other. Namely, current injected from the electrode 117 into the tuning layer 111 is controlled independently from that injected from the electrode 116 into the active layer 113.

As current is flowed in the active region 113, laser oscillation can be excited. As current is flowed in the tuning layer 111, a refractive index of the tuning layer 111 changes due to the plasma effect. Because the effective refractive index in the laser transmission mode also changes, the Bragg wavelength determined by the diffraction grating 114 changes so that the oscillation frequency changes. In this manner, the oscillation wavelength can be changed in a continuous manner by controlling only the current to be injected into the tuning layer 111.

FIG. 4C is a cross sectional view showing another structure of a TTG-DFB laser. In the laser shown in FIG. 4B, the diffraction grating 114 is disposed on the active layer 113 on the side opposite to the intermediate layer 112. In the laser shown in FIG. 4C, a diffraction grating 114 is disposed on a tuning layer 111 on the side opposite to an intermediate layer 112.

SUMMARY OF THE INVENTION

In order to achieve the sufficient quality as a laser source, it is necessary to set a proper coupling coefficient κ (cm$^{-1}$) between light propagating in an optical resonator and a diffraction grating. Generally, the tuning layer 111 is made of semiconductor material having a transition wavelength shorter than that of the active layer 113 so as not to absorb laser light. If the transition wavelength of the tuning layer 111 is set too short, the change in refractive index relative to the change in current cannot be made large. From this reason, the transition wavelength of the tuning layer 111 is set longer than those of the clad layers and the intermediate layer 112.

Because the refractive index of the tuning layer 111 is large, an optical electric field distribution is attracted toward the tuning layer 111. In the TTG-DFB laser having the structure shown in FIG. 4B, if the optical electric field is attracted toward the tuning layer 111, the optical electric field applied to the diffraction grating 114 decreases so that a proper coupling coefficient .kappa. cannot be obtained.

In the laser having the structure shown in FIG. 4C, a proper coupling coefficient .kappa. can be obtained in the small tuning current range. However, as the tuning current is made large, the refractive index of the tuning layer lowers because of the plasma effect so that the optical electric field distribution is attracted toward the active layer 113. Therefore, the optical electric field applied to the diffraction grating 114 decreases so that the coupling factor .kappa. lowers and the oscillation threshold value becomes high. Furthermore, because a loss by free carrier absorption increases, the oscillation threshold value rises synergistically.

An object of this invention is to provide a TTG-DFB laser capable of maintaining a proper coupling coefficient and having good characteristics as a communication light source.

According to one aspect of the present invention, there is provided a semiconductor laser comprising: an active layer for radiating light through stimulated emission by carrier injection; a tuning layer disposed spaced by some distance apart from the active layer in a thickness direction, the tuning layer having a transition wavelength shorter than a wavelength of the light radiated from the active layer; a diffraction grating layer disposed between the active layer and the tuning layer, a refractive index of the diffraction grating layer being periodically changed along an optical resonator direction; a first electrode for supplying the active layer with current; and a second electrode for supplying the tuning layer with current independently from the current to be supplied to the active layer.

Light generated in the active layer is confined mainly in the lamination structure from the active layer to the tuning layer. Because the diffraction grating layer is disposed between the active layer and tuning layer, a coupling coefficient between light and diffraction grating can be raised. A large coupling coefficient can be maintained even if the optical electric field is deviated toward the active layer or tuning layer.

DESCRIPTION OF THE PREFERRED EMBODIMENTS

Figure 1:
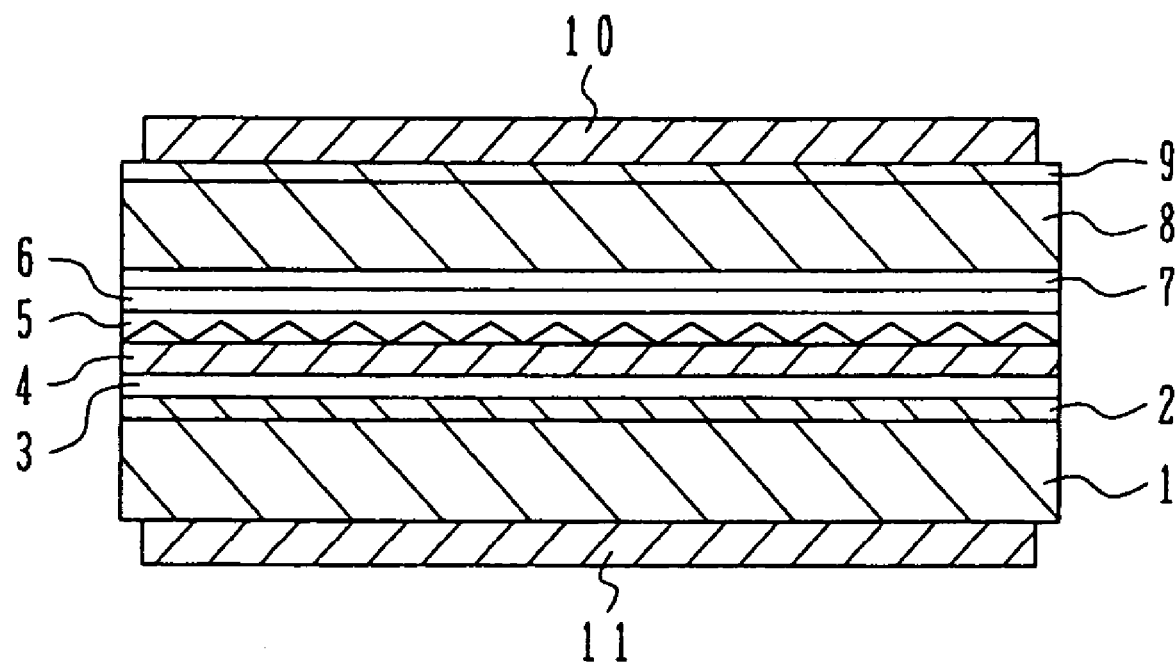
FIG. 1 is a cross sectional view of a TTG-DFB laser according to an embodiment.

FIG. 1 is a cross sectional view of a TTG-DFB laser along a direction (light propagation direction) parallel to the longitudinal direction of an optical resonator, according to an embodiment of the invention. On a substrate 1 made of p-type InP, a buffer layer of p-type InP having a thickness of 1 µm is formed. A tuning layer 3, an intermediate layer 4, a diffraction grating layer 5 and a multiple quantum well active layer 6 are sequentially stacked in this order on the buffer layer 2. The substrate 1 and the buffer layer 2 serve as a clad layer.

The tuning layer 3 is made of undoped $Ga_{0.283}In_{0.717}As_{0.611}P_{0.389}$ and has a thickness of 0.28 µm. The intermediate layer 4 is made of n-type InP and has a thickness of 0.11 µm. The diffraction grating layer 5 has a structure such that a diffraction grating made of n-type $Ga_{0.217}In_{0.783}As_{0.472}P_{0.528}$ is buried in the n-type JnP layer. The detailed structures of this layer will be later described.

The multiple quantum well active layer 6 is formed by alternately laminating well layers of undoped $Ga_{0.305}In_{0.695}As_{0.904}P_{0.096}$, each having a thickness of 5.1 nm and barrier layers of undoped $Ga_{0.283}In_{0.717}As_{0.611}P_{0.389}$, each having a thickness of 10 nm. The uppermost and lowermost layers of the multiple quantum well active layer are the barrier layers, and there are seven well layers.

On the multiple quantum well active layer 6, a separated confinement hetero (SCH) layer 7 is formed which is made of undoped $Ga_{0.182}In_{0.818}As_{0.397}P_{0.603}$ and has a thickness of 20 nm. On the SCH layer 7, an upper clad layer 8 made of p-type InP and a contact layer 9 made of $p^+$-type $Ga_{0.47}In_{0.53}As$ are formed.

An upper electrode 10 is in ohmic contact with the contact layer 9. A lower electrode 11 is in ohmic contact with the bottom surface of the substrate 1.

The output end face of the optical resonator is non-reflection coated and the opposite end face is high-reflection coated.

Next, with reference to FIGS. 2A to 2F, description will be given for a manufacturing method for the TTG-DFB laser of the embodiment shown in FIG. 1.

Figure 2A:
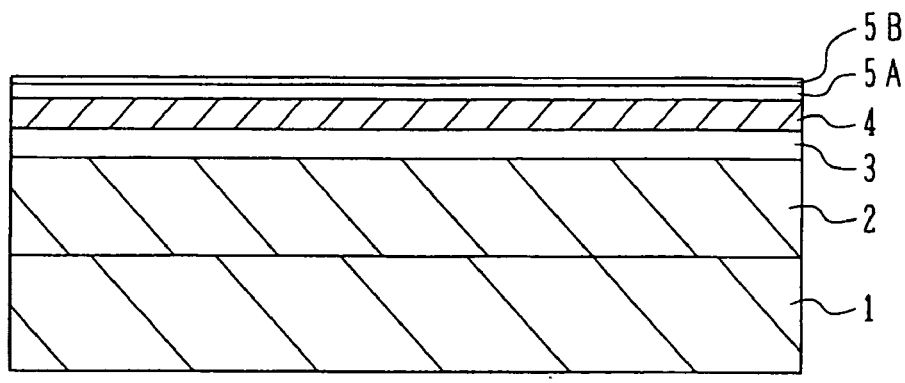
FIGS. 2A to 2F are cross sectional views illustrating a manufacture method for a TTG-DFB laser according to an embodiment.

As shown in FIG. 2A, on the substrate 1 of n-type InP, a buffer layer 2 of p-type InP having a thickness of 1 µm is grown by metal organic chemical vapor deposition (MOCVD). Each layer to be described hereinunder is also grown by MOCVD. Trimethylindium, triethylgallium, arsine and phosphine are used as the source materials for In, Ga, As and P, respectively, and hydrogen is used as carrier gas. Si is used as n-type impurities.

On the buffer layer 2, a tuning layer 3 of undoped $Ga_{0.283}In_{0.717}As_{0.611}P_{0.389}$ having a thickness of 0.28 µm and an intermediate layer 4 of n-type InP having a thickness of 0.11 µm are sequentially grown. On the intermediate layer 4; a first layer 5A of n-type $Ga_{0.217}In_{0.783}As_{0.472}P_{0.528}$ having a thickness of 30 nm and a second layer 5B of n-type InP having a thickness of 10 nm are grown.

Figure 2B:
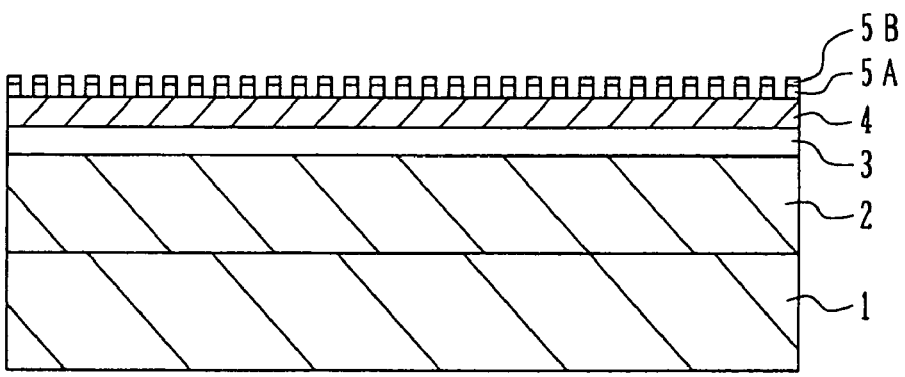

As shown in FIG. 2B, grooves are formed, which are periodically disposed along the longitudinal direction of the optical resonator through the first and second layers 5A and 5B by electron beam exposure techniques. The period of grooves is set to about 240 nm. Each groove is formed through the first layer 5A and exposes the intermediate layer 4 on the bottom surface thereof. The first layer 5A of GaInAsP can be wet etched using mixed solution of $H_2SO_4$, $H_2O_2$ and $H_2O$ as an etchant. By optimizing a mixture ratio, GaInAsP can be selectively etched relative to InP. A diffraction grating having GaInAsP regions, which are periodically disposed, can therefore be formed.

Figure 2C:
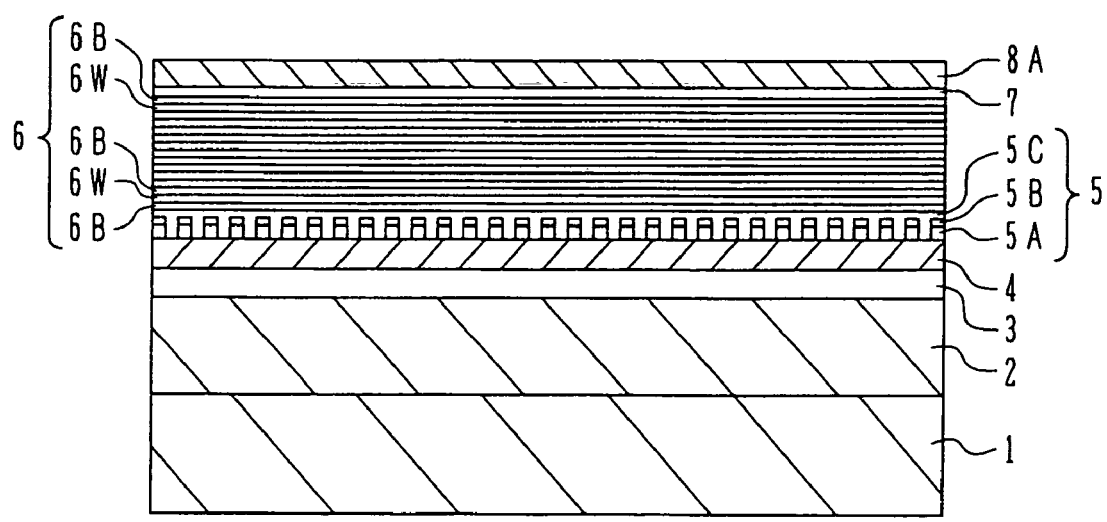

As shown in FIG. 2C, a third layer 5C made of n-type InP, the refractive index of which is different from the refractive index of the diffraction grating, is formed to bury the diffraction grating. The third layer 5C has a thickness of 10 nm as measured on the second layer 5B. A diffraction grating layer 5 is constituted of the first, second and third layers 5A, 5B and 5C.

On the diffraction grating layer 5, a barrier layers 6B of undoped $Ga_{0.283}In_{0.717}As_{0.611}P_{0.389}$ each having a thickness of 10 nm and well layers 6W of undoped $Ga_{0.305}In_{0.695}As_{0.904}P_{0.096}$ each having a thickness of 5.1 nm are alternatively stacked by seven cycles. A barrier layer 6B is formed on the uppermost layer. A multiple quantum well active layer 6 is constituted of seven well layers 6W and eight barrier layers 6B.

On the multiple quantum well active layer 6, an SCH layer 7 of undoped $Ga_{0.182}In_{0.818}As_{0.397}P_{0.603}$ having a thickness of 20 nm is grown. On this SCH layer 7, a first clad layer 8A is grown which is made of p-type InP and has a thickness of 0.2 µm.

Figure 2D:
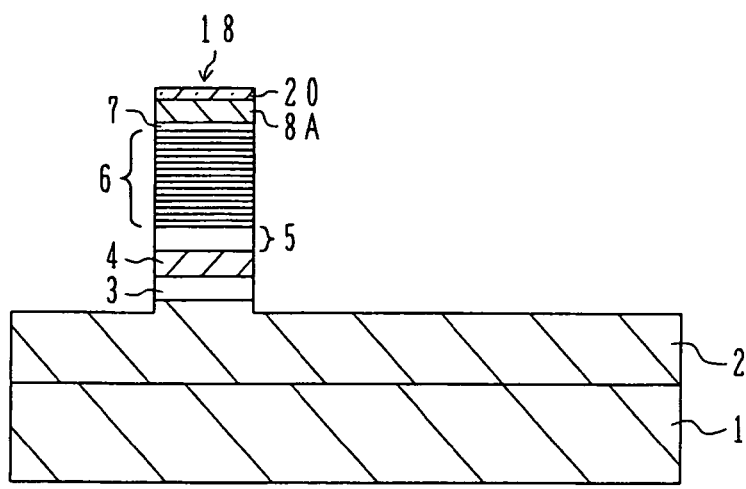
Figure 2E:
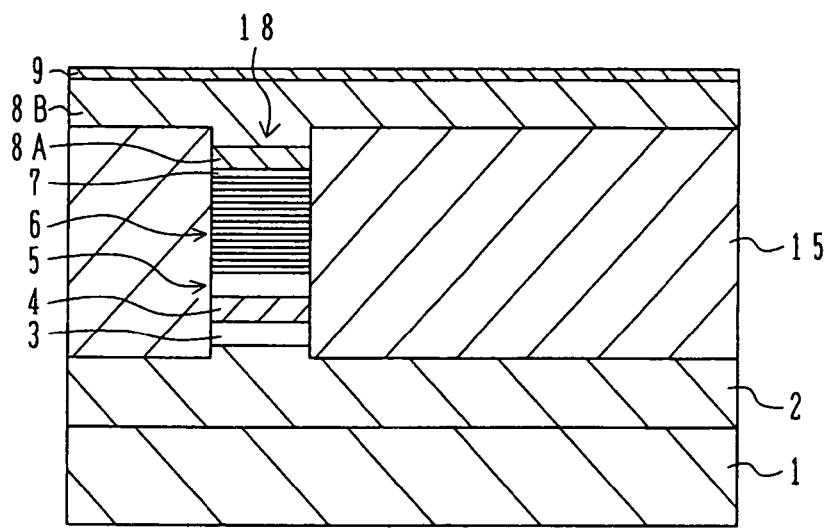
Figure 2F:
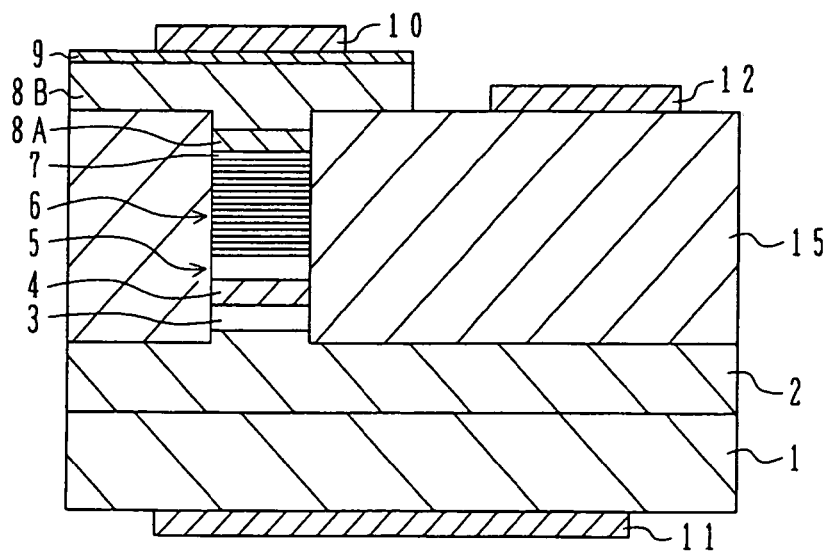

FIGS. 2D to 2F are cross sectional views of the TTG-DFB laser along the direction perpendicular to the longitudinal direction of the optical resonator. As shown in FIG. 2D, in order to leave a striped mesa 18 having the lamination structure from the tuning layer 3 to the first clad layer 8A, the regions on both sides of the mesa 18 are etched down to the surface layer of the buffer layer 2. In this case, a $SiO_2$ film 20 is formed on the first clad layer 8A and used as an etching mask. The width of the mesa 18 is set to about 1 µm.

As shown in FIG. 2E, by leaving the $SiO_2$ film (FIG. 2D) used as the etching mask, n-type InP is selectively grown on both sides of the mesa 18 to form a burying layer 15. After the burying layer 15 is formed, the $SiO_2$ film 20 is removed to expose the first clad layer 8A. On the first clad layer 8A and burying layer 15, a second clad layer 8B of p-type InP is grown. The surface of the second clad layer 8B is generally flat. The first and second clad layers 8A and 8B in the region where the mesa 18 is disposed correspond to the clad layer 8 shown in FIG. 1.

On the second clad layer 8B, a contact layer 9 of $p^+$-type $Ga_{0.47}In_{0.53}As$ is grown.

As shown in FIG. 2F, a partial region of the contact layer 9 and second clad layer 8B is removed to expose a part of the surface of the burying layer 15. An upper electrode 10 is formed on the contact layer 9. A lower electrode 11 is formed on the bottom surface of the substrate 1. A common electrode 12 is formed on the surface of the exposed burying layer 15. Each of the upper and lower electrodes 10 and 11 has the lamination structure of an AuZn layer of 200 nm in thickness disposed on the substrate side and an Au layer of 3 µm in thickness disposed on the AuZn layer. The common electrode 12 has the lamination structure of an AuGe layer of 200 nm in thickness disposed on the substrate side and an Au layer of 3 µm in thickness disposed on the AuGe layer.

Current injected from the upper electrode 10 flows to the common electrode 12 via the multiple quantum well active layer 6, diffraction grating layer 5, intermediate layer 4 and burying layer 15. Current injected from the lower electrode 11 flows to the common electrode 12 via the buffer layer 2, tuning layer 3, intermediate layer 4 and burying layer 15. By controlling the voltage applied across the upper and lower electrodes 10 and 11, excitation current flowing through the multiple quantum well active layer 6 and tuning current flowing through the tuning layer 3 can be controlled independently.

The substrate 1 is cleaved to separate it into laser chips. The output end face is non-reflection coated and the opposite end face is high-reflection coated.

Figure 3:
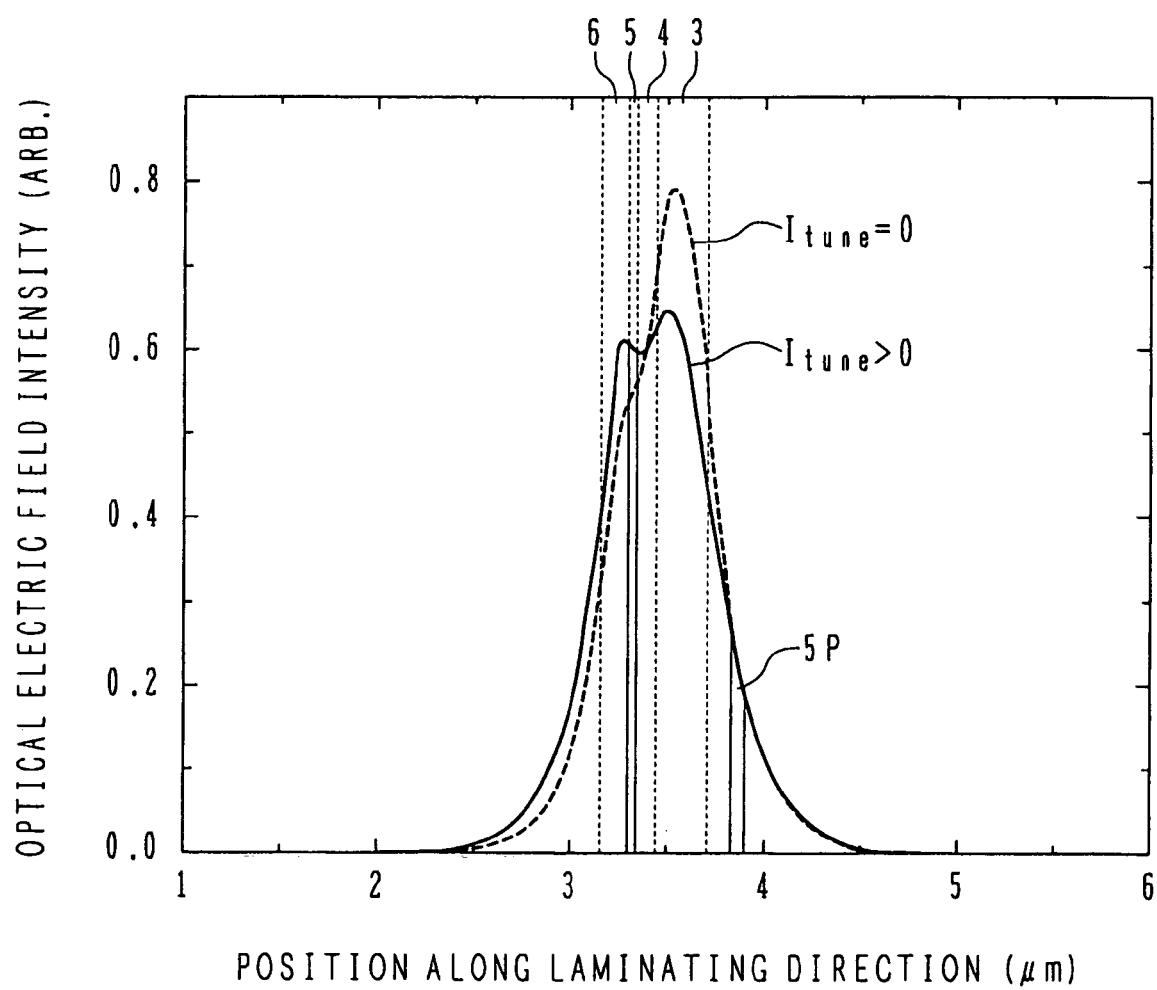
FIG. 3 is a graph showing optical electric field intensity distributions of a TTG-DFB laser of the embodiment along a stacking direction.

FIG. 3 is a graph showing optical electric field intensity distributions of the TTG-DFB laser of the embodiment shown in FIG. 1 as measured along the lamination direction. The abscissa represents a position along the lamination direction in the unit of "µm" and the ordinate represents an optical electric field intensity in the arbitrary unit.

Broken and solid lines in FIG. 3 indicate the optical electric field intensity distributions at tuning currents $I_{tune}$ of 0 and a positive value, respectively. In both cases, the optical electric field distributes mainly over the range from the tuning layer 3 to the multiple quantum well active layer 6. The refractive index of the tuning layer 3 is relatively high at the tuning current $I_{tune}$ of 0 so that the optical electric field exists slightly deviated in the tuning layer 3. As the tuning current $I_{tune}$ is flowed, the refractive index of the tuning layer 3 lowers relatively so that the optical electric field in the tuning layer 3 weakens and that in the multiple quantum well active layer 6 becomes high.

Because the diffraction grating layer 5 is disposed between the tuning layer 3 and multiple quantum well active layer 6, the optical electric field intensity at the position of the diffraction grating layer 5 is high irrespective of whether the tuning current is flowed or not flowed. A relatively large coupling coefficient K can therefore be obtained.

If the tuning current is increased, the optical electric field distributes deviated in the multiple quantum well active layer 6 so that the optical electric field intensity in the diffraction grating layer 5 becomes large. An increase in the oscillation threshold value to be caused by free carrier absorption is therefore suppressed. Generally, as the tuning current is increased, Schottky noises to be caused by spontaneous emission increase so that a light emission spectrum is broadened. In the embodiment, as the tuning current is increased, the coupling coefficient κ becomes large so that broadening the light emission spectrum can be suppressed.

If the coupling coefficient κ at the tuning current of 0 is set to a proper initial value, the coupling coefficient κ at any tuning current will not lower than the initial value. Accordingly, the TTG-DFB laser of the embodiment has high resistance against reflected return light and suitable for application to integration purpose.

Figure 4A:
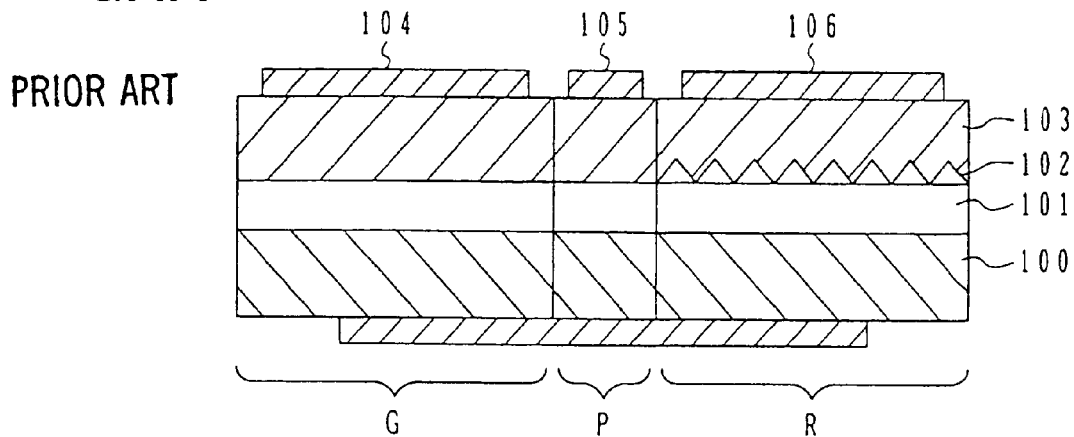
FIGS. 4A to 4C are cross sectional views of conventional DBR and TTG-DFB lasers.
Figure 4B:
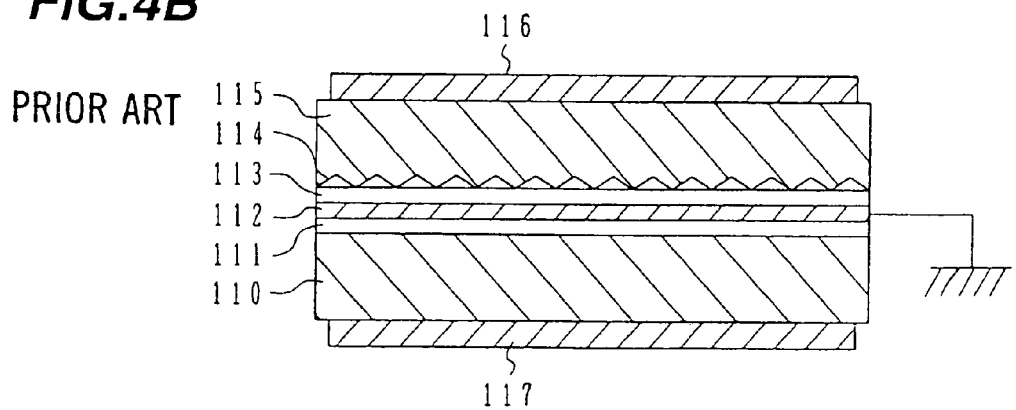
Figure 4C:
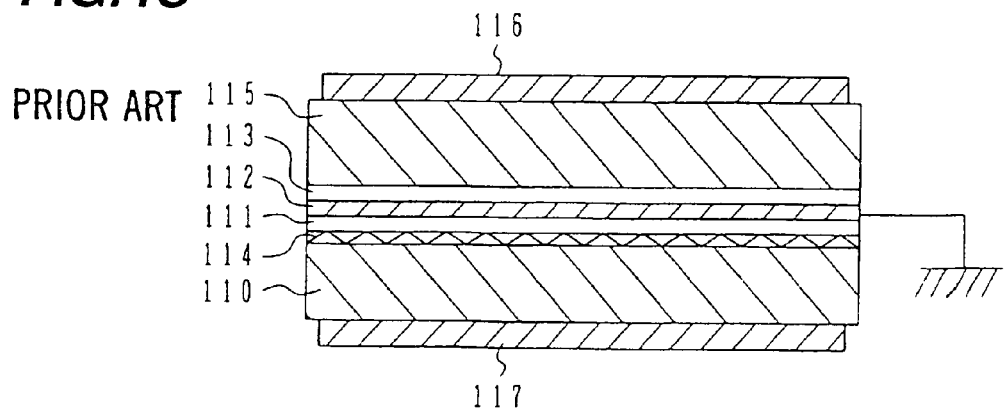

Also shown in FIG. 3 for the purposes of comparison is the position of a diffraction grating layer 5P of the conventional TTG-DFB laser shown in FIG. 4C. Because the diffraction grating layer 5P is disposed outside of the lamination structure sandwiched by the multiple quantum well active layer 6 and tuning layer 3, the optical electric field intensity at the position of the diffraction grating layer 5P is weak. As the tuning current is flowed, the optical electric field is deviated toward the multiple quantum well active layer 6 so that the optical electric field at the position of the diffraction grating layer 5P becomes weak and it becomes difficult to maintain a proper coupling coefficient κ.

As in the embodiment, because the diffraction grating layer 5 is disposed between the multiple quantum well active layer 6 and the tuning layer 3, a relatively large coupling coefficient .kappa. can be obtained irrespective of whether or not a tuning current flows.

In the above-described embodiment, a TTG-DFB laser for the 1.55 µm band has been described. TTG-DFB lasers for other bands may also be manufactured by changing the compositions of the multiple quantum well active layer, intermediate layer and tuning layer.

Also in the embodiment, although the active layer 6 radiating light through stimulated emission is made of multiple quantum wells, it may be made of a single semiconductor layer. Also in the embodiment, although the tuning layer 3 is made of a single semiconductor layer, it may have a multiple quantum well structure. In this case, the transition wavelength of the tuning layer 3 is set shorter than the wavelength of light radiated in the active layer. Light absorption in the tuning layer 3 can thus be prevented.

The present invention has been described in connection with the preferred embodiments. The invention is not limited only to the above embodiments. It will be apparent to those skilled in the art that other various modifications, improvements, combinations, and the like can be made.

I claim:

1. A semiconductor laser comprising:
   an active layer for radiating light through stimulated emission by carrier injection;
   a tuning layer disposed spaced by some distance apart from the active layer in a thickness direction, the tuning layer having a transition wavelength shorter than a wavelength of the light radiated from the active layer;
   an intermediate layer formed on said tuning layer;
   a diffraction grating layer disposed between the active layer and the intermediate layer, a refractive index of the diffraction grating layer being periodically changed along an optical resonator direction;

a first electrode for supplying the active layer with current; and a second electrode for supplying the tuning layer with current independently from the current to be supplied to the active layer.

2. The semiconductor laser according to claim 1, further comprising a pair of clad layers, between which the active layer, the diffraction grating layer and the tuning layer are interposed.

3. The semiconductor laser according to claim 1, wherein the active layer has a multiple quantum well structure alternately stacking quantum well layers and barrier layers.

4. The semiconductor laser according to claim 2, wherein the active layer has a multiple quantum well structure alternately stacking quantum well layers and barrier layers.

5. The semiconductor laser according to claim 1, wherein the tuning layer has a multiple quantum well structure alternately stacking quantum well layers and barrier layers.

6. The semiconductor laser according to claim 2, wherein the tuning layer has a multiple quantum well structure alternately stacking quantum well layers and barrier layers.

7. The semiconductor laser according to claim 1, wherein the diffraction grating layer comprises:

a diffraction grating having a periodical structure along the optical resonator direction; and a burying layer burying the diffraction grating and having a refractive index different from the refractive index of the diffraction grating.

8. The semiconductor laser according to claim 2, wherein the diffraction grating layer comprises:

a diffraction grating having a periodical structure along the optical resonator direction; and a burying layer burying the diffraction grating and having a refractive index different from the refractive index of the diffraction grating.

9. The semiconductor laser according to claim 7, further comprising an intermediate layer disposed between the tuning layer and the diffraction grating layer, wherein the intermediate layer, the diffraction grating layer and the burying layer have a same conductivity type.

10. The semiconductor laser according to claim 8, further comprising an intermediate layer disposed between the tuning layer and the diffraction grating layer, wherein the intermediate layer, the diffraction grating layer and the burying layer have a same conductivity type.

11. The semiconductor laser according to claim 1, further comprising an intermediate layer disposed between the tuning layer and the diffraction grating layer, wherein the intermediate layer, the diffraction grating layer and the burying layer have a same conductivity type.

* * * * *